(12) United States Patent
Oka et al.

(10) Patent No.: US 6,413,797 B2
(45) Date of Patent: Jul. 2, 2002

(54) SEMICONDUCTOR DEVICE AND METHOD FOR MAKING THE SAME

(75) Inventors: Hiroshi Oka; Masaaki Hiromitsu, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/738,537

(22) Filed: Dec. 15, 2000

Related U.S. Application Data

(62) Division of application No. 09/168,716, filed on Oct. 8, 1998, now abandoned.

(30) Foreign Application Priority Data

Oct. 9, 1997 (JP) .............................................. 9-277465
Oct. 29, 1997 (JP) .............................................. 9-297429

(51) Int. Cl.⁷ .............................................. H01L 21/44
(52) U.S. Cl. ........................ 438/108; 438/107; 438/109
(58) Field of Search ................................ 438/108, 109, 438/107, 127, 612, 613, 617

(56) References Cited

U.S. PATENT DOCUMENTS

| | | | |
|---|---|---|---|
| 5,079,102 A | 1/1992 | Tanaka et al. | |
| 5,376,825 A | 12/1994 | Tukamoto et al. | |
| 5,734,199 A | * 3/1998 | Kawakita et al. | 257/737 |
| 5,790,384 A | 8/1998 | Ahmad et al. | |
| 5,795,818 A | 8/1998 | Marrs | |
| 5,854,514 A | 12/1998 | Roldan et al. | |
| 5,858,149 A | 1/1999 | Seo et al. | |
| 5,908,317 A | * 6/1999 | Heo | 438/617 |
| 5,926,694 A | 7/1999 | Chigawa et al. | |
| 5,976,964 A | * 11/1999 | Ball | 438/613 |

FOREIGN PATENT DOCUMENTS

EP          0782191 A2        7/1997

* cited by examiner

Primary Examiner—Kevin M. Picardat
(74) Attorney, Agent, or Firm—Merchant & Gould P.C.

(57) ABSTRACT

A semiconductor device includes a semiconductor chip having a main surface formed with an electrode pad, a package containing the semiconductor chip, a component element connected with the electrode pad within the package, a gold bump formed on the electrode pad, and a gold connecting member. The gold connecting member has an end bonded to the gold bump, and the other end bonded to the component.

6 Claims, 16 Drawing Sheets

SEMICONDUCTOR DEVICE AND METHOD FOR MAKING THE SAME

This application is a divisional of application Ser. No. 09/168,716, filed Oct. 8, 1998, now abandoned which application(s) are incorporated herein by reference.

BACKGROUND OF THE INVENTION

1. Field of the Invention

The present invention relates to a semiconductor device, and a method for making the same. More particularly, the present invention relates to a semiconductor device containing such a semiconductor chip as a ferroelectric random access memory which will become unstable in operation under a high temperature, and a method for making such a semiconductor device.

2. Background Art

Much effort is being made in recent years in developing a nonvolatile memory utilizing the spontaneous polarization behavior of a ferroelectrics having a high dielectric constant. This type of memory is usually called the ferroelectric random access memory (hereinafter called FRAM). The FRAM has a construction in which a planer type ferroelectric capacitor is formed on a layer of a common CMOS transistor. The FRAM enables overwriting of stored information at an extremely high speed and at a low voltage by reversing the direction of polarization.

However, when heated, the ferroelectrics used in the FRAM loses the ferroelectricity above a certain temperature (Curie temperature), and becomes paraelectric in which state the spontaneous polarization will not occur. A common Curie temperature of the ferroelectrics used in the FRAM is 170–180 degrees Celsius. If the FRAM containing such a ferroelectrics is heated to this Curie temperature or above, the memory operation becomes unstable, or the memory will no longer operate. In other words, the FRAM is susceptible to heat.

On the other hand, not only the FRAM but also the semiconductor chip in general includes pieces of metal wire for example, for establishing electrical connection between electrodes of the semiconductor chip and external components such as inner leads of the lead frame and a circuit pattern formed on a substrate. This type of electrical connection using the metal wire is commonly performed by a method such as thermocompression bonding or ultrasonic bonding.

The thermocompression bonding is performed as follows. Specifically, a component element to which the bonding is to be made is heated to a relatively high temperature (about 400 degrees Celsius). Then, the metal wire is pressed onto a wirebonding region. However, this method is not suitable for wirebonding to a semiconductor chip which is susceptible to heat, because the semiconductor chip has to be heated up to 400 degrees Celsius. On the other hand, the ultrasonic bonding is performed without heating the component element to be bonded. Specifically, the metal wire is first pressed onto the bonding region, and then ultrasonic wave is applied. However, the ultrasonic bonding method is disadvantageous in that an intense ultrasonic wave can break the wire.

In order to compensate for the above shortcomings in the thermocompression bonding and the ultrasonic bonding, thermosonic bonding is often employed. Specifically, the component element to be bonded is heated only to a relatively low temperature (about 200 degrees Celsius). Then, the metal wire is pressed onto the bonding region, and ultrasonic wave of moderate intensity is applied.

Still however, the thermosonic bonding is only suitable for wirebonding a common type of semiconductors because the semiconductor chip must be heated to about 200 degrees Celsius. The thermosonic bonding is still not suitable for wirebonding a semiconductor chip such as the FRAM which is extremely susceptible to heat, becoming very unstable in operation if heated to 170–180 degrees Celsius.

There is another problem. Specifically, a surface of the semiconductor chip is commonly formed with bonding pads for wirebonding. These pads are formed by aluminum for example. However, aluminum is easily oxidized to form a coat of oxide, which weakens the bond between the bonding pad and the wire. This problem becomes more significant at a higher bonding temperature, and in order to remove the coat of oxide, the ultrasonic wave of a greater intensity must be applied at a risk of breaking the metal wire.

DESCLOSURE OF THE INVENTION

It is therefore an object of the present invention to provide a semiconductor device in which the electrode of the semiconductor chip and the component element to be connected with the electrode are connected appropriately with each other without damaging a property of the semiconductor chip.

Another object of the present invention is to provide a semiconductor device including a ferroelectric memory chip in which the electrode of this memory chip and the component element to be connected with the electrode are connected appropriately with each other without heating the ferroelectric memory chip beyond a predetermined temperature.

According to a first aspect of the present invention, there is provided a semiconductor device having a following arrangement.

Specifically, the semiconductor device comprises a semiconductor chip having a main surface formed with an electrode pad, a package containing the semiconductor chip, a component element electrically connected with the electrode pad within the package, a gold bump formed on the electrode pad, and a gold wire having an end bonded to the gold bump and the other end bonded to the component.

According to the above arrangement, the electrode pad conventionally formed by aluminum is covered by the gold bump. This eliminates need for such an operation at the time of wirebonding as removing a coat of oxide formed on the electrode pad. Thus, there is no need for applying a large amount of energy at the time of wirebonding such as applying intense ultrasonic wave for removing the coat of oxide, or heating the semiconductor chip to a high temperature. Further, at the time of wirebonding, the gold bump absorbs part of pressure applied by the capillary. Thus, the semiconductor chips are better protected from damage caused by the wirebonding operation. Still further, the wire made of gold is bonded to the electrode pad made of gold. Since this bond is made between the same kind of metal, only a smaller amount of energy is necessary to achieve the bonding. Still further, the bond is not susceptible to oxidization, and therefore can keep a good quality of connection.

According to a preferred embodiment, the component element is another semiconductor chip. This another semiconductor chip is formed with an electrode pad formed with a gold bump thereon. The other end of the wire is bonded to the gold bump of said another semiconductor chip.

According to another preferred embodiment, the component element is a substrate. The substrate is provided with a terminal portion, and the other end of the wire is bonded to the terminal portion.

According to the preferred embodiment, the semiconductor chip is a ferroelectric memory chip. The ferroelectric memory chip is a nonvolatile memory chip utilizing the spontaneous polarization behavior of a ferroelectrics having a high dielectric constant. This type of memory enables overwriting of stored information at an extremely high speed and at a low voltage, by reversing the direction of polarization. The ferroelectrics used in the ferroelectric memory chip is susceptible to heat (becoming unable to polarize spontaneously at a temperature of 170–180 degrees Celsius). For this reason, the ferroelectric memory chip becomes unstable in operation once heated above a specific temperature. According to the present invention, in order to achieve the wirebonding between the electrode pad and the gold wire, a smaller amount of energy may be applied as described above. For example, the heating temperature may be about 100 degrees Celsius, and the ultrasonic wave may be less intense. Thus, it is possible to establish an appropriate electric connection between the ferroelectric memory chip and a component element to be connected to the ferroelectric memory chip, without the risk of damaging the operational stability of the ferroelectric memory chip.

According to a second aspect of the present invention, there is provided a semiconductor device having a following arrangement.

Specifically, the semiconductor device comprises a first semiconductor chip having a main surface formed with an electrode pad, a second semiconductor chip having a main surface faced to the main surface of the first semiconductor chip and formed with an electrode pad opposed to the electrode pad of the first semiconductor chip, and a package containing the first and the second semiconductor chips. Each of the electrode pads of the first and the second semiconductor chips is provided with a gold bump formed thereon. The first semiconductor chip and the second semiconductor chip are electrically connected with each other via a gold connecting member placed between the pair of the opposed gold bumps.

According to the above arrangement, the same advantages are obtained from the formation of the gold bump on the electrode pad of each semiconductor chip, as well as the other advantages as described above according to the first aspect of the present invention.

According to a preferred embodiment, the gold connecting member is a gold bump formed in the first semiconductor chip, or an easily deformable gold stud bump formed on the gold bump in the second semiconductor chip. When the electrical connection between the electrode pads of the two semiconductor chips is established via the gold stud, the electrode pad formed with the gold bump is pressed to the gold stud bump. During this operation, the stud bump which is easily deformable, protects the two semiconductor chips from damage caused by excessive pressure applied to the main surfaces of respective semiconductor chips faced to each other. It should be noted that the stud bump may be such as having a tip portion made easily deformable, or having another predetermined portion made easily deformable.

According to the preferred embodiment, one or both of the first semiconductor chip and the second semiconductor chip is a ferroelectric memory chip. As described earlier, the ferroelectric memory is susceptible to heat. According to the present invention, electrical connection between the first semiconductor chip and the second semiconductor chip can be established without applying a large amount of heat or an intense level of ultrasonic wave because of the easily deformable stud bump.

According to the preferred embodiment, the main surface of the first semiconductor chip and the main surface of the second semiconductor chip are bonded to each other by a resin adhesive. With this arrangement, the first semiconductor chip and the second semiconductor chip are mechanically connected by the resin adhesive while allowing the pair of electrodes each formed with the gold bump to be electrically connected to each other. Thus, a high quality of electric connection can be kept as mentioned earlier, and at the same time, the main surface of each semiconductor can be well protected.

According to the preferred embodiment, the resin adhesive is an epoxy resin or a phenol resin.

According to a third aspect of the present invention, a method for manufacturing a semiconductor device comprising the above described steps as part thereof.

Specifically, the semiconductor device manufactured by this method comprises a first semiconductor chip having a main surface formed with an electrode pad, a second semiconductor chip having a main surface faced to the first semiconductor chip and formed with an electrode pad opposed to the electrode pad of the first semiconductor chip, and a package containing the first and the second semiconductor chips. The first and the second semiconductor chips are electrically connected with each other within the package. The method comprises steps of:

forming a gold bump on the electrode pad of the first semiconductor chip, forming a gold bump on the electrode pad of the second semiconductor chip, forming an easily deformable gold stud bump on the gold bump of the first semiconductor chip or on the gold bump of the second semiconductor chip, and pressing the semiconductor chips to each other while facing the first and second semiconductor chips with each other so that the electrode pad on the first semiconductor chip faces the electrode pad on the second semiconductor chip.

The semiconductor device manufactured according to the above method provides the same advantages as described according to the second aspect of the present invention.

The formation of the gold bumps can be achieved by a method of gold plating for example. The stud bumps can be formed by generally the same operation as the first bonding in the wire bonding step of the gold wire. Specifically, an end portion of the gold wire is drawn out of a tip portion of a capillary. The end of the gold wire is then heated into a ball of molten gold in a hydrogen flame or electric discharge. The capillary is then moved to above the gold bump of the first semiconductor chip, and lowered so that the ball of molten gold is pressed onto the gold bump. When the gold wire is bonded, while the gold wire is still soft, the capillary is raised to tear the gold wire off.

According to the preferred embodiment, the first semiconductor chip and the second semiconductor chip are pressed to each other via a resin adhesive placed between the first and second semiconductor chips.

The resin adhesive used in the above operation is an epoxy resin adhesive or a phenol resin adhesive for example. Each of them is a cold setting type adhesive, or a thermosetting type adhesive setting at a relatively low temperature such as about 100 degrees Celsius.

Other features and advantages of the present invention should become clearer from the detailed description to be made hereafter with reference to the attached drawings.

PREFERRED EMBODIMENTS

Preferred embodiments of the present invention will be described in specific details, referring to the accompanying drawings.

Figure 1:
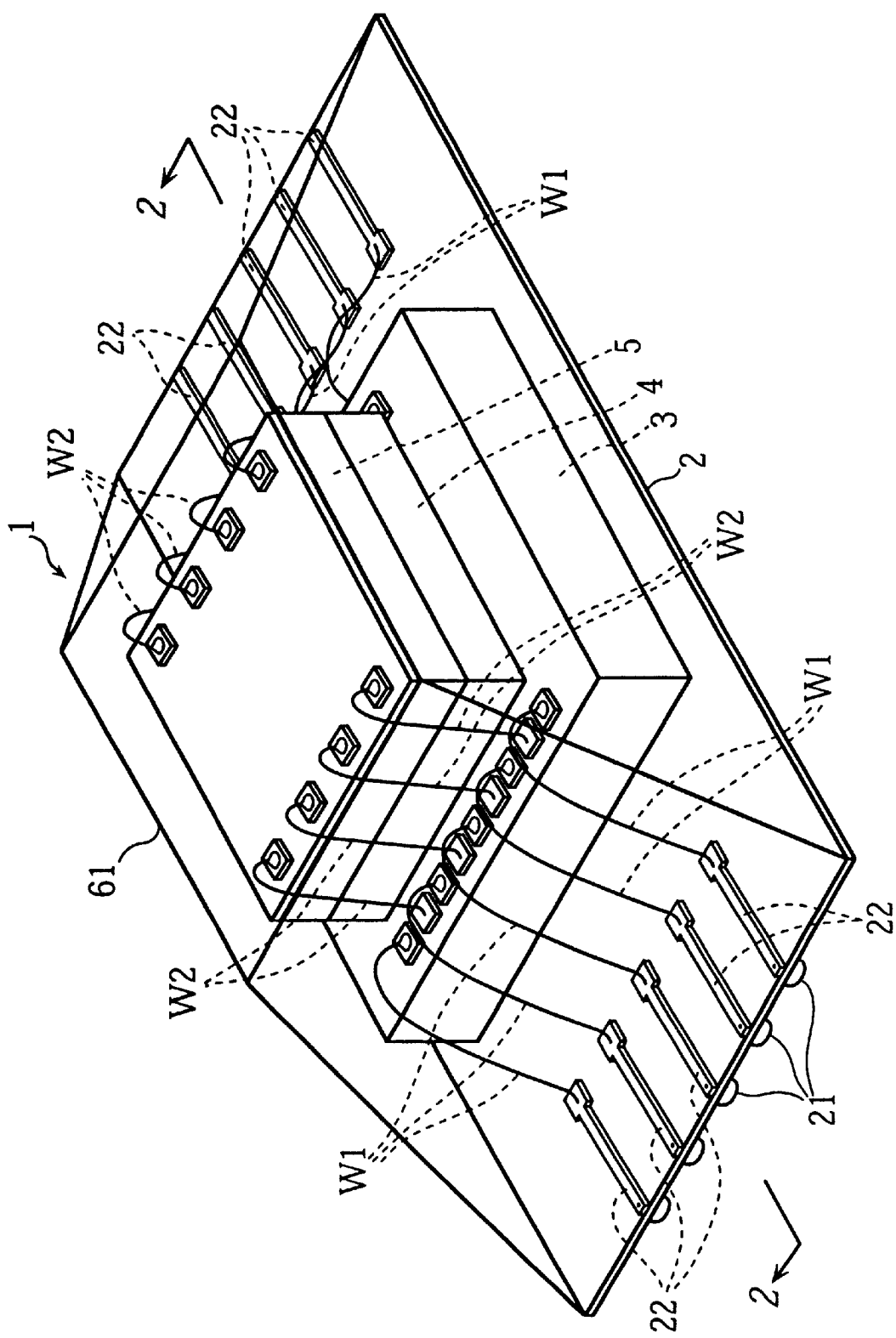
FIG. 1 is an overall perspective view of a semiconductor device as an embodiment of the present invention.
Figure 2:
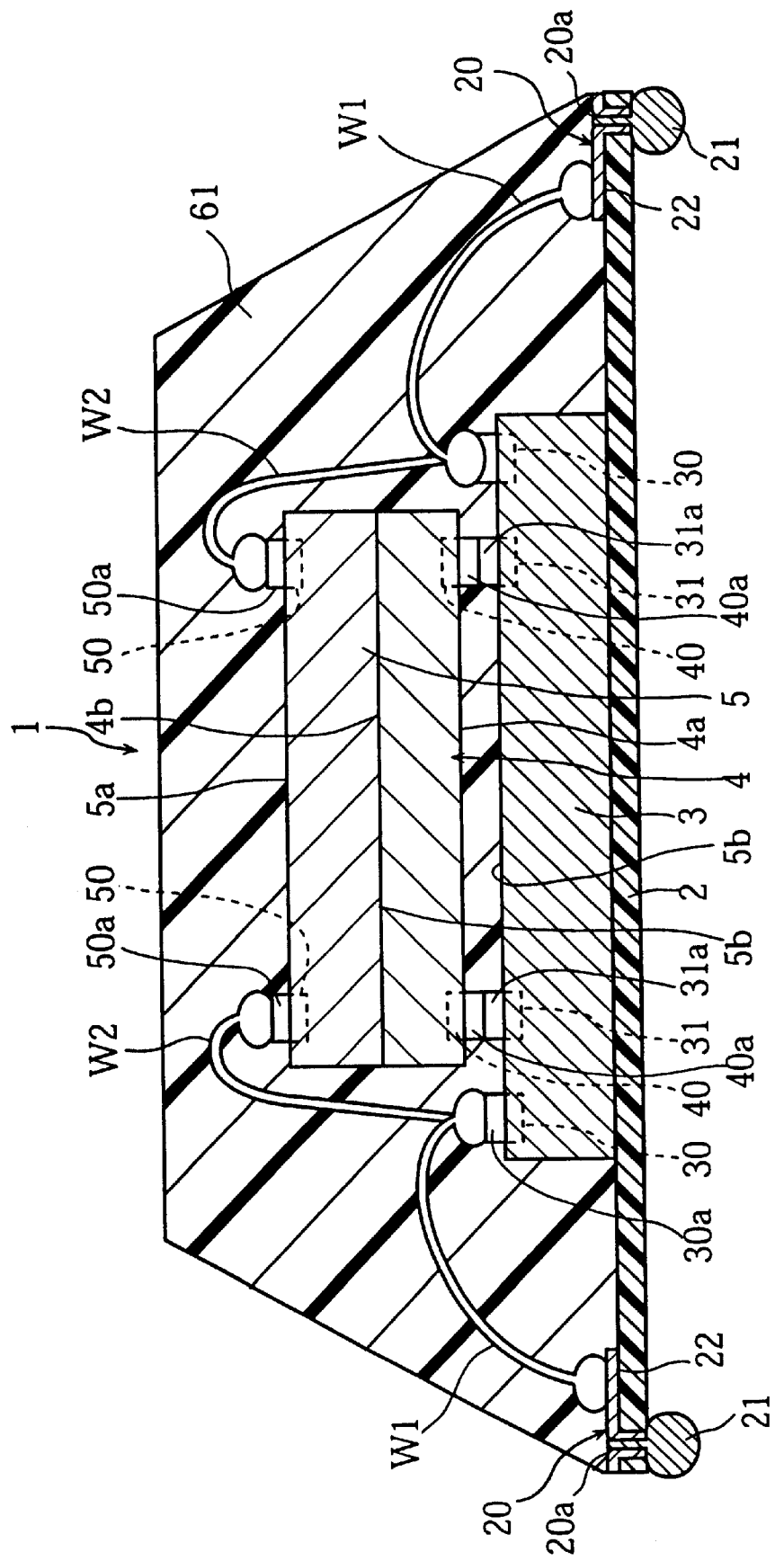
FIG. 2 is a sectional view taken in lines 2—2 in FIG. 1.

FIG. 1 is an overall perspective view of a semiconductor device as an embodiment of the present invention. FIG. 2 is a sectional view taken in lines 2—2 in FIG. 1.

As shown in FIGS. 1 and 2, a semiconductor device 1 generally comprises a film substrate 2 made of a polyimide resin for example, a first semiconductor chip 3 mounted to the film substrate 2, a second semiconductor chip 4 electrically connected with the first semiconductor chip 3, and a third semiconductor chip 5 mounted onto the second semiconductor chip 4.

The film substrate 2 has two end portions each formed with a plurality of through-holes 20a. At each of these through-holes 20a, a corresponding terminal 20 is formed. Each terminal 20 is provided with a thin-film terminal portion 22 formed on an upper surface of the film substrate 2, and a ball terminal portion 21 formed on a lower surface of the film substrate 2. The thin-film terminal portion 22 and the ball terminal portion 21 are electrically connected with each other via the through-hole 20a. Note should be made here that the thin-film terminal portion 22 is formed by copper for example, whereas the ball terminal portion 21 is formed by solder for example. Further, a desirable number of the through-holes 20a and the terminals 20 may be formed depending upon design.

The first semiconductor chip 3 includes a main surface 3a having side edge portions each formed with two kinds of plural electrode pads 30, 31. Each kind of electrode pads is made of aluminum for example, and formed in a row. Further, each of the electrode pads 30, 31 is formed with a gold bump 30a or 31a. These gold bump may be formed for example, when the semiconductor chip is being manufactured from a wafer, by plating the wafer with gold. The gold bump 30a and the terminal 20 of the film substrate 2 are connected with each other by gold wire W1 for electrical connection between the film substrate 2 and the first semiconductor chip 3. Needless to say, each of the electrode pads 30, 31 is electrically connected with a predetermined circuit element (not shown) formed in the main surface 3a of the first semiconductor chip 3. It should be noted that the first semiconductor chip 3 is bonded to the film substrate 2 by an unillustrated layer of resin such as epoxy resin.

The second semiconductor chip 4 includes a main surface 4a having side edge portions each formed with a plurality of electrode pads 40. Each of the electrode pads 40 is formed with a gold bump 40a. The gold bump 40a and the gold bump 31a of the first semiconductor chip 3 are electrically connected with each other, by means of anisotropic conductive film or solder paste for example. Each of the electrode pads 40 is electrically connected with a predetermined circuit element (not shown) formed in the main surface 4a of the second semiconductor chip 4.

The third semiconductor chip 5 includes a main surface 5a having side edge portions each formed with a plurality of electrode pads 50. Each of the electrode pads 50 is formed with a gold bump 50a. The gold bump 50a and the gold bump 30a of the first semiconductor chip 3 are electrically connected with each other by gold wire w2. Each of the electrode pads 50 is electrically connected with a predetermined circuit element (not shown) formed in the main surface 5a of the third semiconductor chip 5. It should be noted that the third semiconductor chip 5 has a lower surface 5b bonded to an lower surface 4b of the second semiconductor chip 4 by an epoxy resin for example.

The first, second and third semiconductor chips 3, 4, 5, the film substrate 2, and the gold wire W1, W2 are protected by a resin package 61 made of an epoxy resin, for example, formed by means of injection molding.

Next, a manufacturing method of the semiconductor device 1 shown in FIGS. 1 and 2 will be described briefly with reference to FIGS. 3 through 8.

Figure 3:
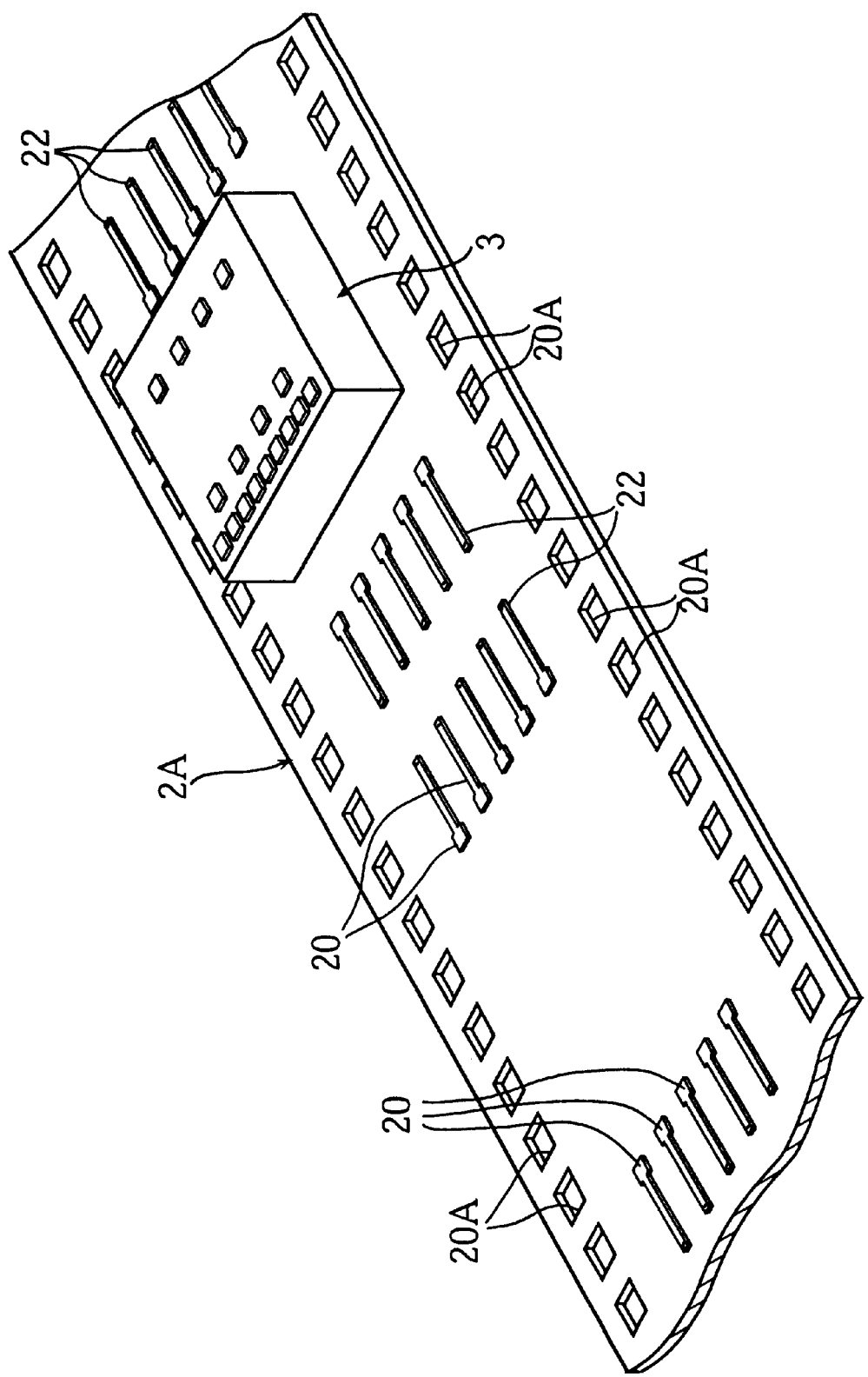
FIG. 3 shows a step of manufacturing the semiconductor device in FIG. 1, illustrating a state in which a first semiconductor chip is mounted on a long ribbon of resin film.

First, the thin-film terminal portion 22 is formed on a resin film 2A which is clearly seen in FIG. 3. The resin film 2A may be made of a polyimide resin for example, and has two widthwise edge portions each formed with engaging holes 20A so that the resin film may be transferred continuously or intermittently by a predetermined mechanism. The thin-film terminal portion 22 on the resin film 2A may be made by first forming a coat of copper on the surface of the resin film 2A by means of spattering, vaporizing, or CVD, and then etching the coat of copper.

Next, the first semiconductor chip 3 is mounted on the resin film 2A as shown in FIG. 3. This step is achieved by first applying a liquid or solid resin adhesive 60 to the resin film 2A or a surface 3b of the first semiconductor chip 3, and then by lowering the first semiconductor chip 3 onto the resin film 2A. The resin adhesive 60 may be a cold setting resin, or a thermosetting resin setting at a temperature reached during a wirebonding step to be described later. The resin may be an epoxy resin or a phenol resin for example. As mentioned earlier, the first semiconductor chip 3 is formed with the gold bumps 30a, 31a. These gold bumps 30a, 31a may be formed by plating the electrode pads 30, 31 with gold, after forming a predetermined circuit elements in a wafer for example.

Figure 4:
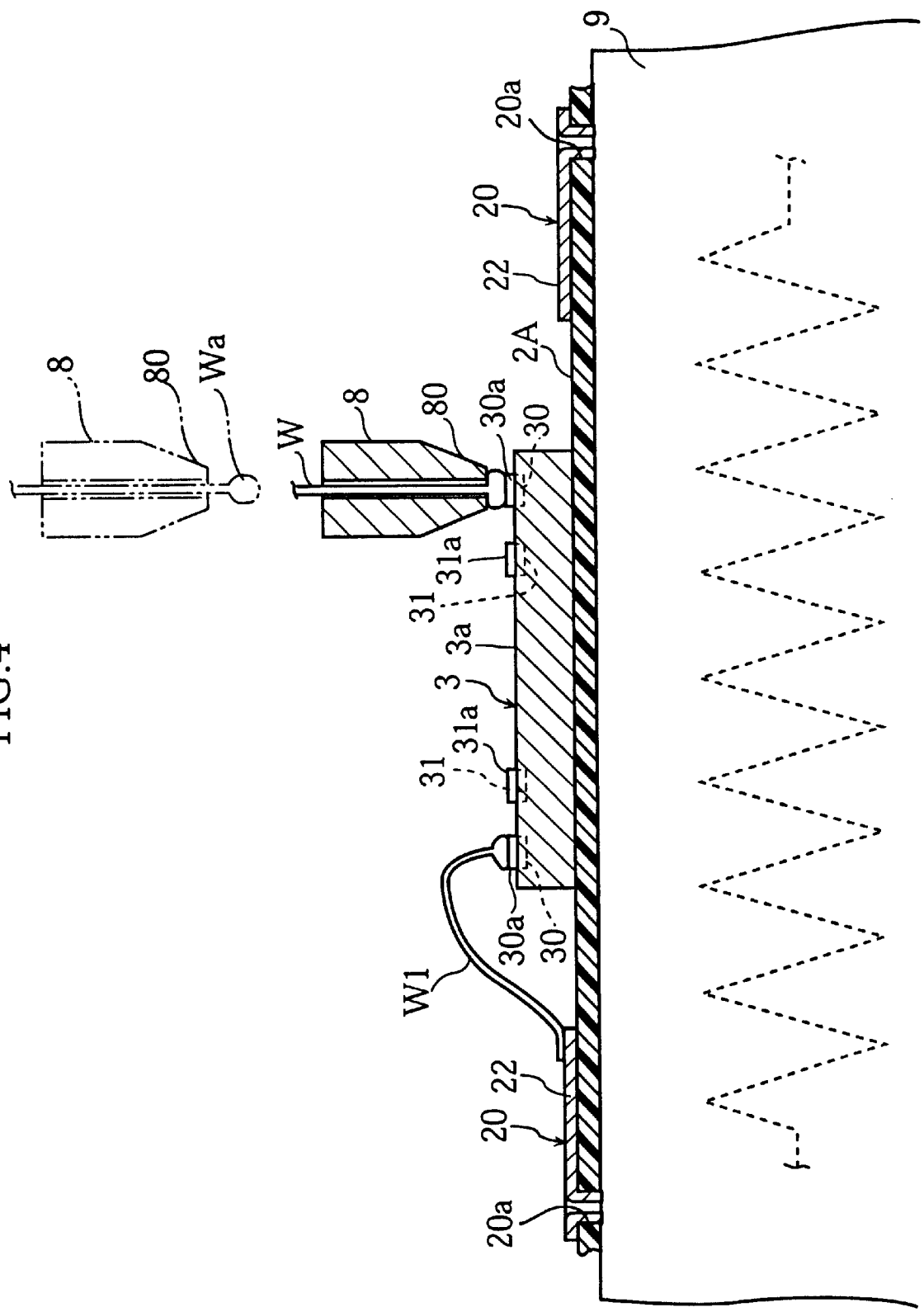
FIG. 4 shows a step of manufacturing the semiconductor device in FIG. 1, illustrating a state in which a terminal of the resin film and a gold bump of the first semiconductor chip are being connected with each other by wirebonding (first bonding).
Figure 5:
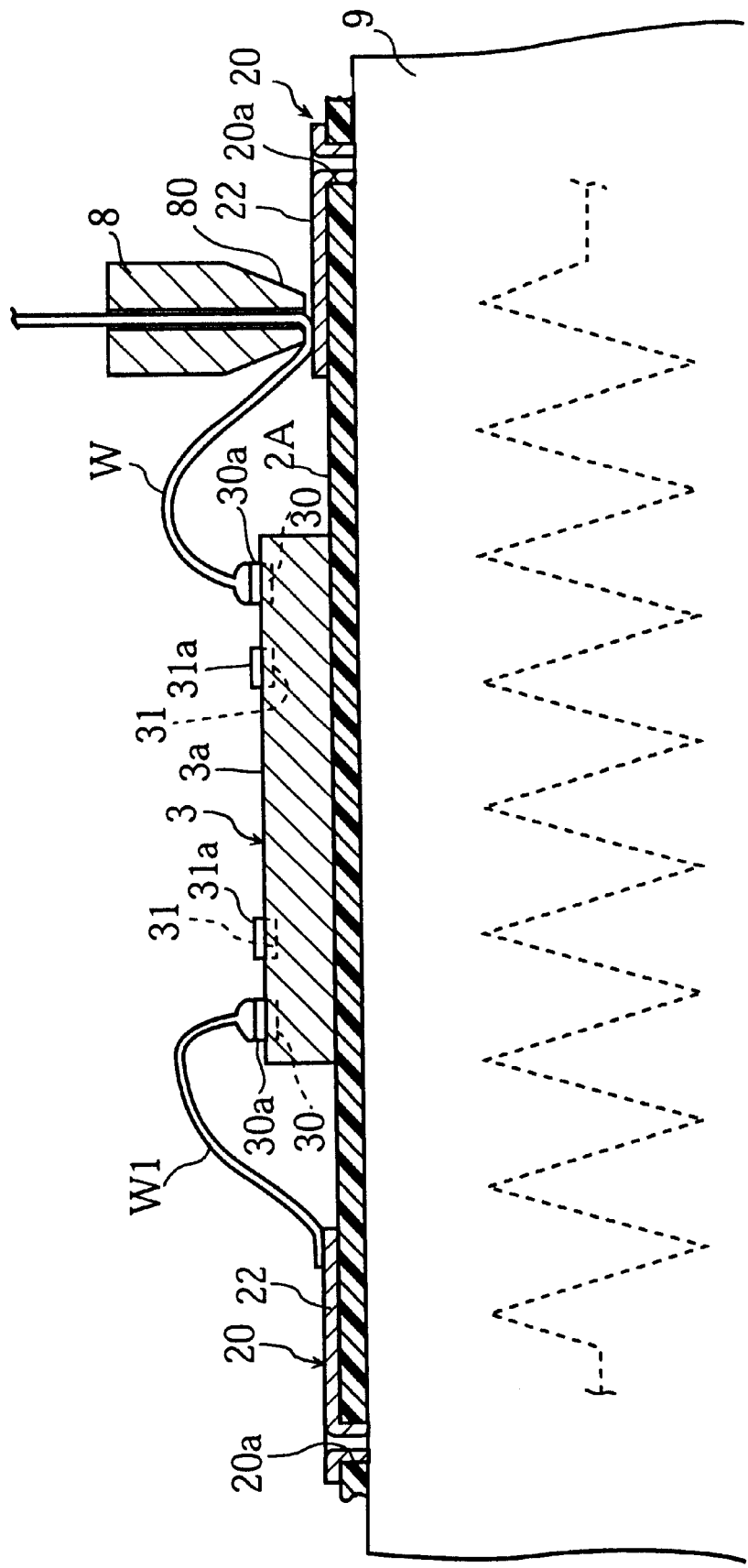
FIG. 5 shows a step of manufacturing the semiconductor device in FIG. 1, illustrating a state in which the terminal of the resin film and the gold bump of the first semiconductor chip are being connected to each other by wirebonding (second bonding).

Next, as shown in FIGS. 4 and 5, the thin-film terminals 22 are respectively connected to the gold bumps 30a of the third semiconductor chip 3 via the gold wire W. This step is performed by using a method known as the thermosonic bonding. The thermosonic bonding is performed for example, while the resin film 2A is held on and heated by a supporting table 9. The supporting table 9 heats the first semiconductor chip 3 to a temperature of 100–200 degrees Celsius. The thermosonic bonding comprises the first bonding shown in FIG. 4 and the second bonding shown in FIG. 5.

As clearly shown in FIG. 4, the first bonding is performed by repeating a cycle of steps described below. Specifically, an end portion of the gold wire W is drawn out of a tip portion 80 of a capillary 8. The end of the gold wire W is then heated into a ball of molten gold Wa in a hydrogen flame or electric discharge. The capillary 8 is then moved to above the gold bump 30a of the first semiconductor chip, and lowered so that the ball of molten gold Wa is pressed onto the gold bump 30a. It should be noted that supersonic wave may be applied to the bonding location when the gold ball Wa is pressed. Next, the second bonding is performed as clearly shown in FIG. 5. Specifically, with the end of the gold wire W bonded to the bump 30a, the capillary 8 is moved to above the thin-film terminal portion 22, while allowing the gold wire W to be drawn out of the capillary 8. The tip portion 80 of the capillary 8 is then lowered so that the gold wire W is pressed onto the upper surface of the thin-film terminal portion 22, to which ultrasonic wave is applied at the same time. When the gold wire W is bonded, the capillary 8 is then raised to tear the gold wire W off, completing the cycle of wirebonding.

According to the above arrangement, the wirebonding region in the first semiconductor 3, i.e. the gold bump 30a is formed by gold. Therefore, the wirebonding region (the gold bump 30a) is resistant to oxidization. This eliminates need for such an operation as removing a coat of oxide formed in the wirebonding region (the gold bump 30a). It is no longer necessary to apply a large amount of energy, such as very intense ultrasonic wave, for removing the coat of oxide at the time of wirebonding, or heating the first semiconductor chip 3 or the resin film 2A to a high temperature.

As has been described above, the first bonding of the wirebonding cycle is performed by first heating the end portion of the gold wire W into a molten ball of gold Wa, and then pressing this molten ball to the bonding region (i.e. gold bump 30a). Since the bonding region is the bump 30a made of gold, when the end portion of the gold wire W is pressed to the bonding region, the gold bump 30a acts as a cushion, absorbing part of pressure, reducing damage to the first semiconductor chip 3.

Further, since the wire W used for the bonding is made of gold, the bond made by the first bonding is a bonding between gold and gold, i.e. the bonding between the same metal resistant to oxidization. As a result, compared to the conventional bonding which is made between different metals (e.g. gold and aluminum), the bonding can be completed by a smaller amount of energy. Further, when the bonding region (i.e. the gold bump 30a) is connected to the gold wire W, the bonding is made between gold and gold as mentioned, and for this reason, the bond will stay as a stable bond without risk of oxidization.

Figure 6:
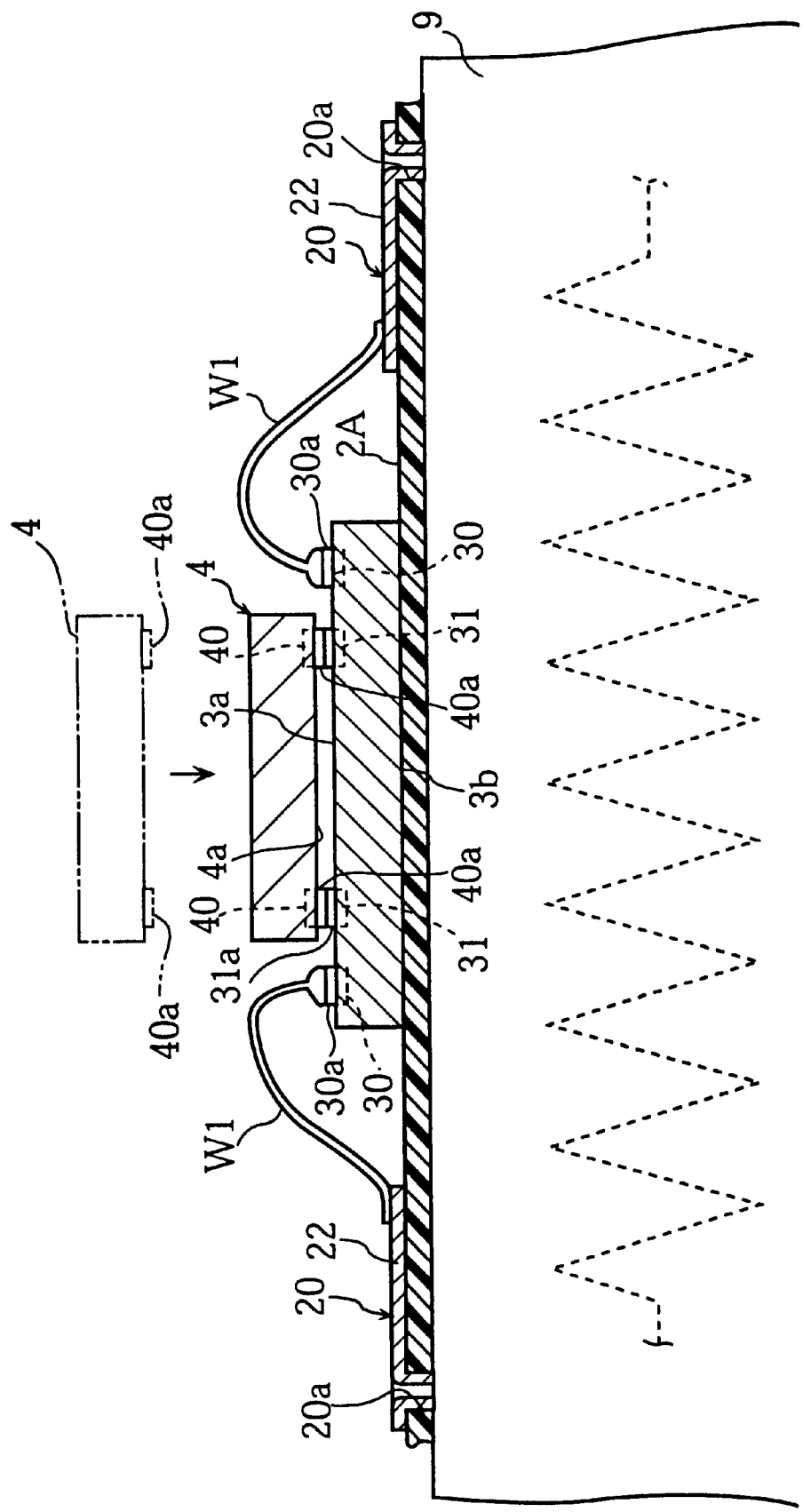
FIG. 6 shows a step of manufacturing the semiconductor device in FIG. 1, illustrating a state in which the first semiconductor chip is mounted with a second semiconductor chip.

Next, as shown in FIG. 6, the gold bumps 40a of the second semiconductor chip 4 are faced respectively to the gold bumps 31a of the first semiconductor chip 3, and then the second semiconductor chip 4 is pressed against the first semiconductor chip 3, bringing the gold bumps 31a and the gold bumps 40a into electrical connection. This step can be achieved for example, by using a conventional chip mounting machine for positioning the second semiconductor chip 4. It should be noted that in this step, in order to achieve a better electrical connection between the two gold bumps 31a, 40a, the gold bump 31a of the first semiconductor chip 3 or the gold bump 40a of the second semiconductor chip 4 is applied with solder paste before the two bumps are pressed to each other. Alternatively, a layer of anisotropic conductive film may be placed between the tow semiconductor chips 3, 4.

Figure 7:
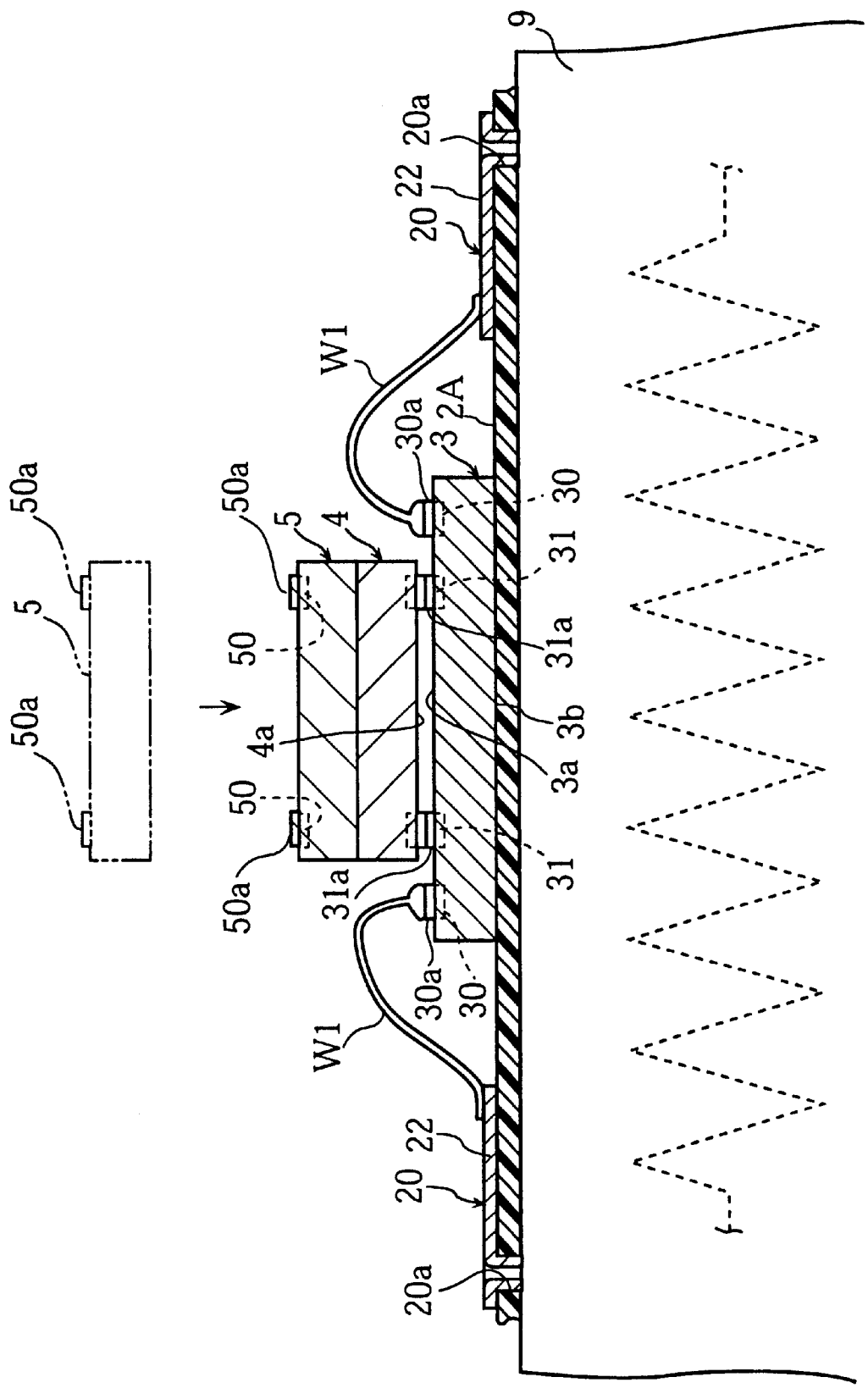
FIG. 7 shows a step of manufacturing the semiconductor device in FIG. 1, illustrating a state in which the second semiconductor chip is mounted with a third semiconductor chip.

Next, as shown in FIG. 7, the second semiconductor chip 4 is mounted with the third semiconductor chip 5. Again in this step, the mounting can be achieved by using a conventional chip mounting machine for positioning the second semiconductor chip 4. It should be noted that the bonding in this step is performed by a layer of resin adhesive such as an epoxy resin applied between the second semiconductor chip 4 and the third semiconductor chip 5.

Figure 8:
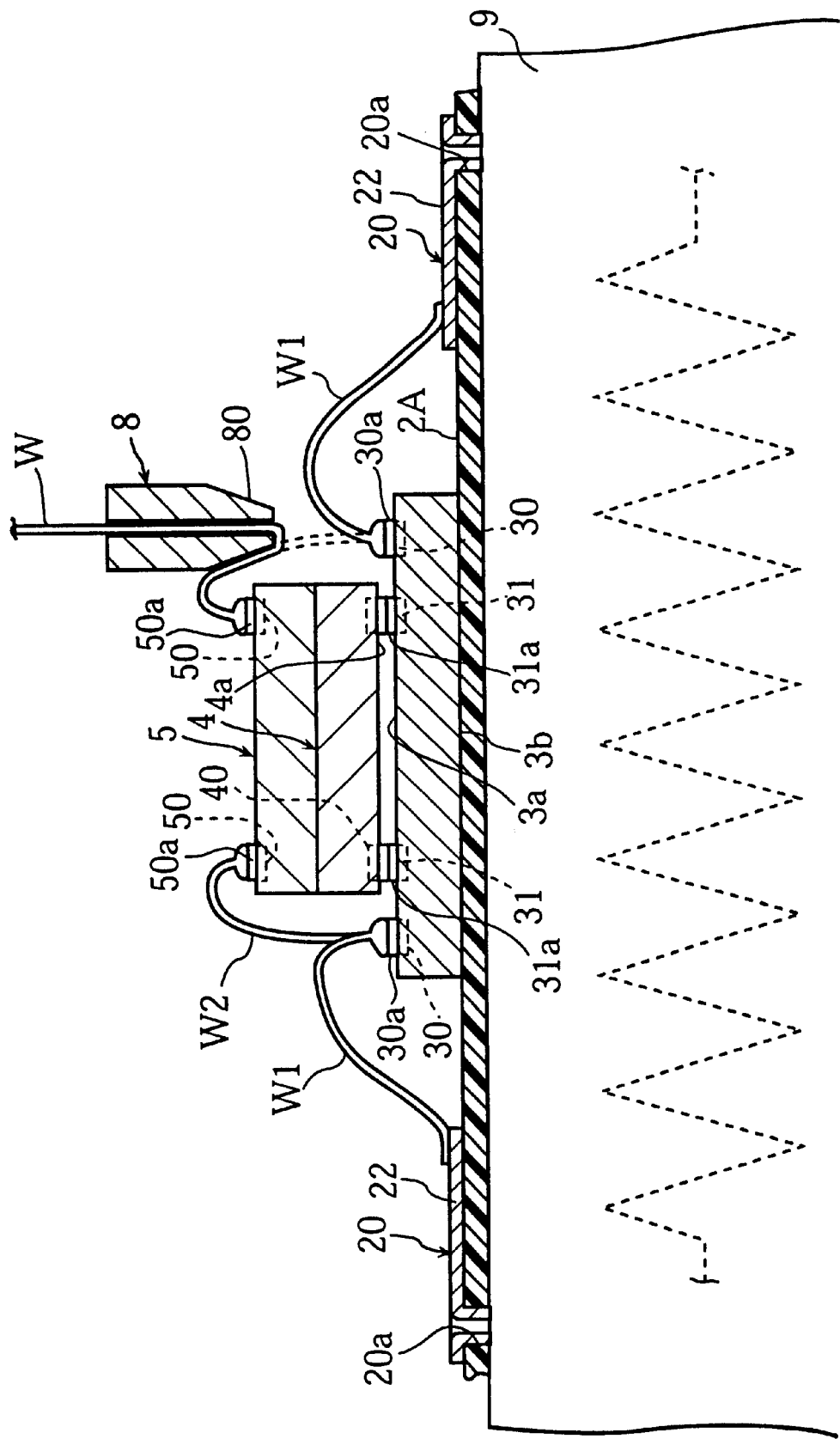
FIG. 8 shows a step of manufacturing the semiconductor device in FIG. 1, illustrating a state in which the first semiconductor chip and the third semiconductor chip are being connected to each other by wirebonding.

Next, as shown in FIG. 8, the gold bump 50a of the third semiconductor chip 5 and the gold bump 30a of the first semiconductor 3 are electrically connected by wire. This step is performed in the same way as the wirebonding was made between the thin-film terminal portion 22 of the resin film 2a and the gold bump 30a of the first semiconductor chip 3. Now, in this particular connection between the two gold bumps 30a, 50a, both of the first bonding region (i.e. gold bump 50a) and the second bonding region (i.e. gold bump 30a) are made of projected pieces of gold. Thus, when the capillary 8 is pressed onto the bonding region, each of the gold bumps 30a, 50a acts as a cushion, absorbing part of pressure, reducing damage to respective first and third semiconductor chips 3, 5 as already mentioned above. This is particularly advantageous in the second bonding. Specifically, in the second bonding, the capillary 8 must be slid while being pressed in order to cut the gold wire W. This brings the first semiconductor chip under a greater risk of being damaged. However, the gold bump 30a formed as the region for the second bonding significantly reduce the damage to the first semiconductor chip 3.

Next few steps will be described without referring to drawings. Specifically, the first through third semiconductor chips 3, 4, 5 and the gold wire W1, W2 will be buried into a resin package 61. This resin package 61 is formed for example, by injection molding using a predetermined resin. Then, the ball terminal portions 21 are formed by solder for example, in the lower surface of the of the resin film 2A to fill the through-holes 20a. Finally, the resin film is cut into pieces to obtain individual semiconductor device 1 shown in FIGS. 1 and 2. Needless to say, the resin used in this resin packaging step should be a cold setting resin or a thermosetting resin with the setting temperature up to 100 degrees Celsius. The resin may be an epoxy resin or phenol resin.

According to the present embodiment, each of the wirebonding regions is the gold bump 30a or 50a, and the gold wore W is used as the bonding wire. Therefore, the resulting bond is between the same kind of metal which is more resistant to oxidization. Thus, as already described above, the bond can be made by a smaller amount of energy. As a result, it becomes possible to perform the wirebonding even to a ferroelectric memory chip which is very susceptible to heat. Further, during the above steps where a resin adhesive is necessary, a cold setting resin or a thermosetting resin which sets at a temperature up to 100 degrees Celsius is used. Thus, properties of the ferroelectric memory chip will not be damaged during the process of solidifying the resin. In other words, the present embodiment provides a method for manufacturing a semiconductor device suitably employed to the manufacture of the semiconductor chip 1 containing the ferroelectric memory chip which will become unstable once heated to 170–180 degrees Celsius.

Figure 9:
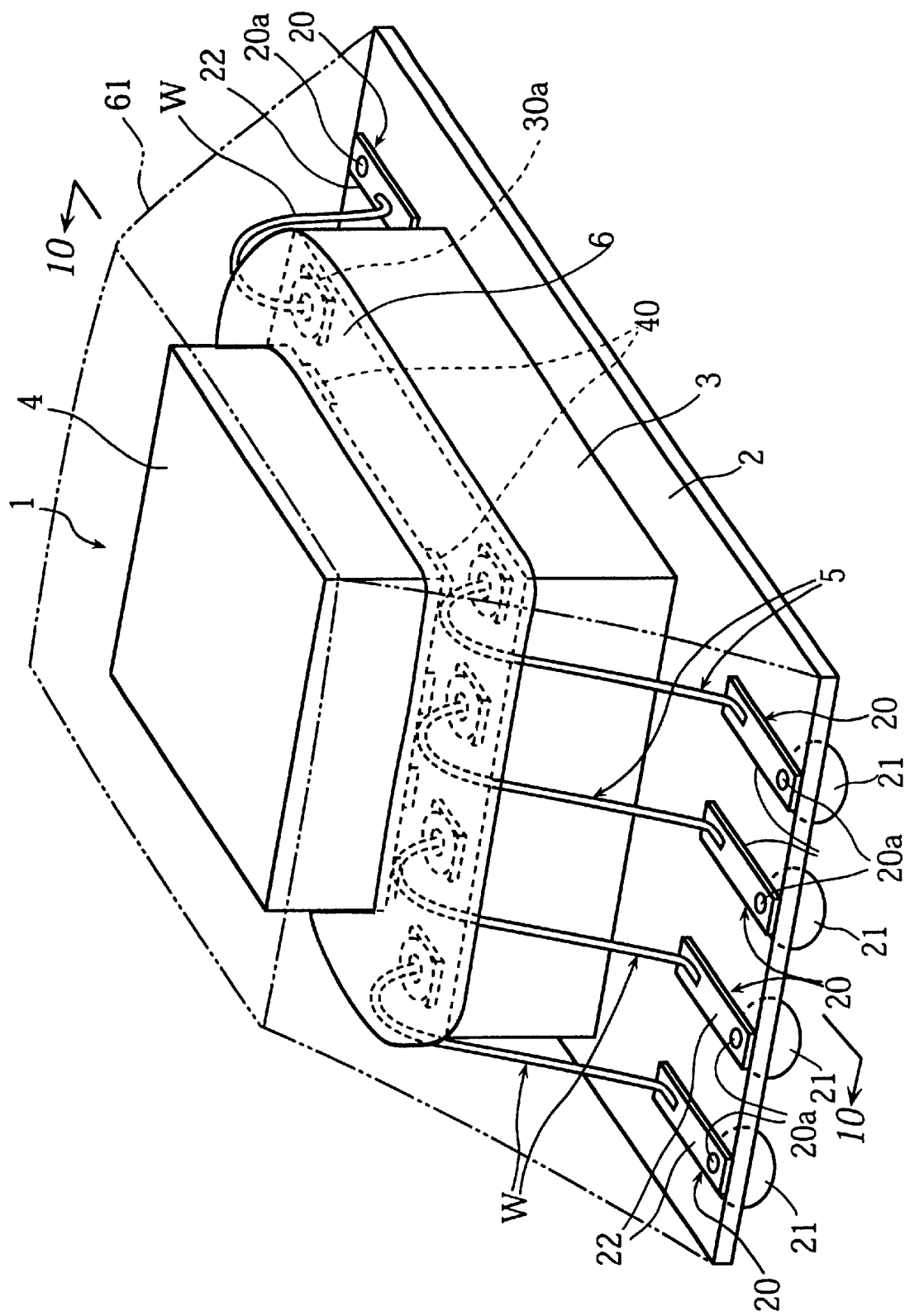
FIG. 9 is a see-through perspective view of a semiconductor device as another embodiment of the present invention.
Figure 10:
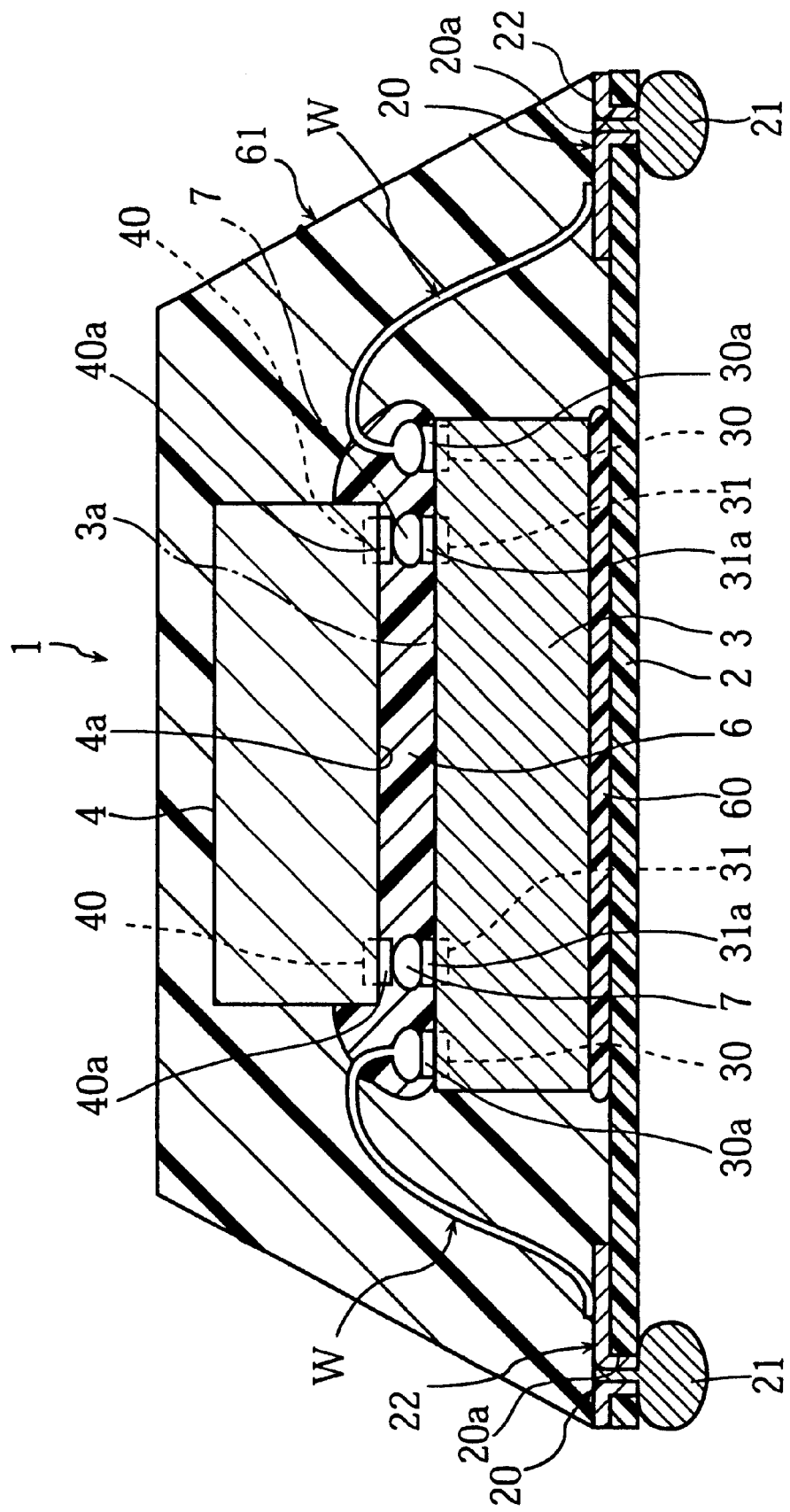
FIG. 10 is a sectional view taken in lines 10—10 in FIG. 10.

Next, FIG. 9 is a see-through perspective view of a semiconductor device as another embodiment of the present invention. FIG. 10 is a sectional view taken in lines 10—10 in FIG. 9.

As shown in FIGS. 9 and 10, a semiconductor device 1 generally comprises a film substrate 2 made of a polyimide resin for example, a ferroelectric memory chip 3 (ferroelectric random access memory, hereinafter called FRAM chip), and a semiconductor chip 4 electrically connected with the FRAM chip 3.

As clearly shown in FIGS. 9 and 10, the film substrate 2 has two end portions each formed with a plurality of through-holes 20a. At each of these through-holes 20a, a corresponding terminal 20 is formed. Each terminal 20 is provided with a thin-film terminal portion 22 formed on an upper surface of the film substrate 2, and a ball terminal portion 21 formed on a lower surface of the film substrate 2. The thin-film terminal portion 22 and the ball terminal portion 21 are electrically connected with each other via the through-hole 20a. Note should be made that the thin-film terminal portion 22 is formed by copper for example, whereas the ball terminal portion 21 is formed by solder for example.

The FRAM chip 3 is a nonvolatile memory chip utilizing the spontaneous polarization behavior of a ferroelectrics having a high dielectric constant. As clearly shown in FIG. 10, the FRAM chip 3 includes a main surface 3a having side edge portions each formed with a plurality of a first electrode pads 30 and a second electrode pads 31 each made of aluminum for example. Each of the electrode pads 30, 31 is electrically connected with a predetermined circuit element (not shown) formed integrally with the FRAM chip 3. Each of the electrode pads 30, 31 is formed with a corresponding first gold bump 30a or a second gold bump 31a protruding from the main surface 3a. These gold bumps may be formed by gold plating for example. Each of the second gold bumps 31a is formed with a stud bump 7 which is easily deformable. The stud bump at least has a predetermined weak portion which easily deforms under pressure. The FRAM chip 3 is bonded to the film substrate 2 by a layer of resin 60 such as epoxy resin.

As clearly shown in FIGS. 9 and 10, the terminal 20 of the film substrate 2 and the first gold bump 30a of the FRAM chip 3 are electrically connected with each other via gold wire W. The connection by the wire W between the terminal 20 and the first gold bump 30a is performed by a known method of thermosonic wirebonding for example. The thermosonic bonding is performed for example, by heating the FRAM chip 3 and the film substrate 2 to a predetermined temperature by a heater, then by pressing the gold wire W onto the first gold bump 30a of the FRAM3 or the thin-film terminal 22 of the film substrate 2. The ultrasonic wave is applied during the pressing.

Conventionally, in the above thermosonic bonding, the component to which the bond is to be made must be heated to about 200 degrees Celsius for example. This high temperature accelerates oxidization of the first electrode pad 30, and therefore there must be a step of eliminating the coat of aluminum oxide in order to enhance the connection between the gold wire W and the first electrode pad 30. In order to expose a clear surface in the wirebonding region of the electrode pad 30 for bonding the gold wire W, comparatively strong ultrasonic wave must be applied, with an increased risk that the gold wire W can be cut.

In the above arrangement for electrical connection between the FRAM chip 3 and the film substrate 2 according to the present embodiment, the first gold bump 30a formed on the surface of the first electrode pad 30 acts for protection. Thus, even when the FRAM chip 3 is heated at the time of bonding, the first electrode pad 30a is much less susceptible to oxidization. Furthermore, the first gold bump 30a is made of gold which in itself is very resistant to oxidization, and of course the gold wire W is very resistant to oxidization, too. As a result, there is much less need for considering the elimination of the oxide coat in the wirebonding step, and it is therefore possible to reduce the amount of energy to be applied for connecting the first gold bump 30a with the gold wire W. Further, since the bond is made between the same kind of metal (i.e. gold and gold), it is possible to achieve the bonding between the first gold bump 30a and the gold wire W by applying a smaller amount of energy than is needed in the conventional bonding which is between different metals (such as gold and aluminum). Another advantage is that a good state of bonding can last long since the bond is a gold-to-gold bonding.

As clearly shown in FIG. 10, the semiconductor chip 4 includes a main surface 4a having side edge portions each formed with electrode pads 40 corresponding to the second gold bumps 31a of the FRAM chip 3. Each of the electrode pads 40 is formed with a gold bump terminal 40a protruding from the main surface 4a. Each pair of the second gold bump 31a of the FRAM chip 3 and the gold bump terminal 40a of the semiconductor chip 4 sandwiches the stud bump 7. Thus, the second gold bump 31a and the gold bump terminal 40a are electrically connected with each other via the stud bump 7. Each of the electrode pads 40 is electrically connected with a predetermined circuit element (not shown) formed integrally with the semiconductor chip 4. It should be noted that the semiconductor chip 4 may be an FRAM chip, or another kind of semiconductor chip depending on design.

In the above electrical connection between the FRAM chip 3 and the semiconductor chip 4, the second gold bump 31a is formed on the surface of the second electrode pad 31. This second gold bump 31a covers and protects the second electrode pad 31. Thus, in the same manner as in the first electrode pad 30, the second electrode pad 31 is protected from oxidization. Furthermore, the second gold bump 31a, also made of gold as is the first gold bump 30a, has surfaces much less susceptible to oxidization compared to the conventional electrode pad made of aluminum for example. Needless to say, the surface of the stud bump 7, also made of gold, is very resistant to oxidization. Since the bond between the second gold bump 31a and the stud bump 7 is a bond between materials each having a good resistance to oxidization, it is not necessary to apply as large an amount of energy as needed to remove the coat of oxide, at the time of bonding.

As exemplified above, according to the present embodiment, the bonding between the first gold bump 30a and the gold wire W, and the bonding between the second gold bump 31a and the stud bump 7 can each be achieved by applying a smaller amount of energy. Therefore, when establishing electrical connection between the FRAM chip 3 and the film substrate 2 or the semiconductor chip 4, even if the FRAM chip 3 or the film substrate 2 must be heated, the heating temperature may be only to 100 degrees Celsius for example, and the ultrasonic energy may be less intense. Thus, according to the present embodiment, even if the FRAM chip 3 is very susceptible to heat and may become unstable in operation once heated up to 170–180 degrees Celsius, it is still possible to make a proper electrical bonding between this ferroelectric memory chip and the film substrate 2 or the semiconductor chip 4, without damaging the property of the ferroelectric memory, and without the risk of cutting the gold wire W.

As already mentioned above, the electrical connection between the FRAM chip 3 and the semiconductor chip 4 is made via the stud bumps 7. As clearly shown in FIG. 10, mechanical connection between the FRAM chip 3 and the semiconductor chip 4 is made by an adhesive 6. The adhesive 6 may be an epoxy resin or a phenol resin for example.

As clearly shown in FIGS. 9 and 10, the FRAM chip 3, the second semiconductor chips 4, the film substrate, and the gold wire W are buried into a resin package made of an epoxy resin for example. The resin package made by injection molding for example, protects these components as well as facilitating handling.

Next, a method for manufacturing the semiconductor device 1 shown in FIGS. 9 and 10 will be described with reference to FIGS. 11 through 16.

The method for manufacturing the above semiconductor device 1 comprises steps of: forming the first and second gold bumps 30a, 31a in respective predetermined locations of the FRAM chip 3; forming the thin-film terminal portion 22 in a predetermined locations of a long ribbon of resin film 2A from which the film substrate 2 is separated; connecting the FRAM chip 3 with the thin-film terminal portion 22 by the gold wire W; forming the easily deformable stud bump 7 on each of the second gold bumps 31 of the FRAM chip 3; applying the resin adhesive 6 to the main surface 3a (which is formed with the gold bumps) of the FRAM chip 3; facing the second gold bumps 31a of the FRAM chip 3 with respective gold bump terminals 40a of the semiconductor chip 4 for sandwiching the stud bumps 7 between the second gold bumps 31a and the gold bump terminals 40a; mechanically bonding the FRAM chip 3 and the semiconductor chip 4 with each other; and separating individual semiconductor devices from the resin film 2A.

Though not illustrated, the formation of the first and second gold bumps 30a, 31a on the first and second electrode pads 30, 31 of the FRAM chip 3 may be performed by electroplating for example. Specifically, a photo-resist layer is formed on a surface of a wafer already formed with a plurality of predetermined circuits integrally therewith. The photo-resist layer is formed to exposed each of the electrode pads 30, 31. The wafer is then submerged in electrolytic solution and electric current is passed through the wafer serving as the negative electrode for forming a coat of gold plating on each of the electrode pads 30, 31. After the coat of plating is formed, the photo-resist layer is then removed, leaving the coat of gold plate as the first and second gold bumps 30a, 31a. The individual FRAM chip 3 each formed with the first and second gold bumps 30a, 31a is obtained by dividing the wafer. The step of forming the gold bumps 40a in the semiconductor chip 4 is performed in the same manner.

During the electroplating step such as the one described above, the temperature of the electrolytic liquid can rise but only below 100 degrees Celsius in most cases. Further, the plating is performed in the absence of air while the wafer is submerged in the electrolytic liquid. Thus, even if each of the electrode pads 30, 31 is made of aluminum which is susceptible to oxidization, there is little risk for the electrode pads 30, 31 to be formed with the coat of oxide. Hence, each of the gold bumps 30a, 31a is formed on the surface of the electrode pads 30, 31 which is relatively free of oxide coating. For this reason, the gold bumps 30a, 31a are bonded to the corresponding electrode pad 30 or 31 under a desirable condition.

Figure 11:
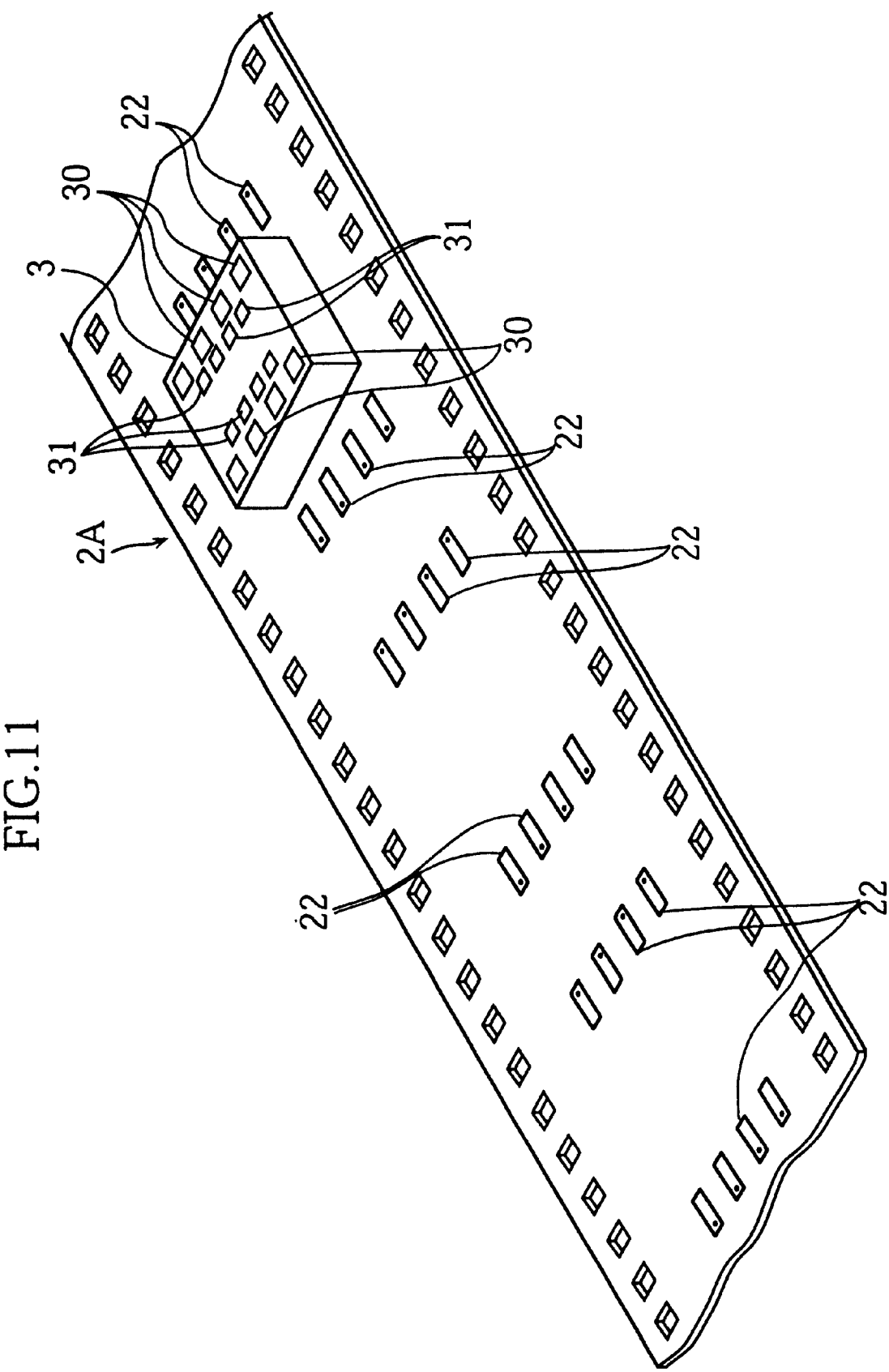
FIG. 11 is a perspective view showing a step of manufacturing the semiconductor device in FIG. 9, illustrating a state in which an FARM chip is mounted on a long ribbon of film.
Figure 12:
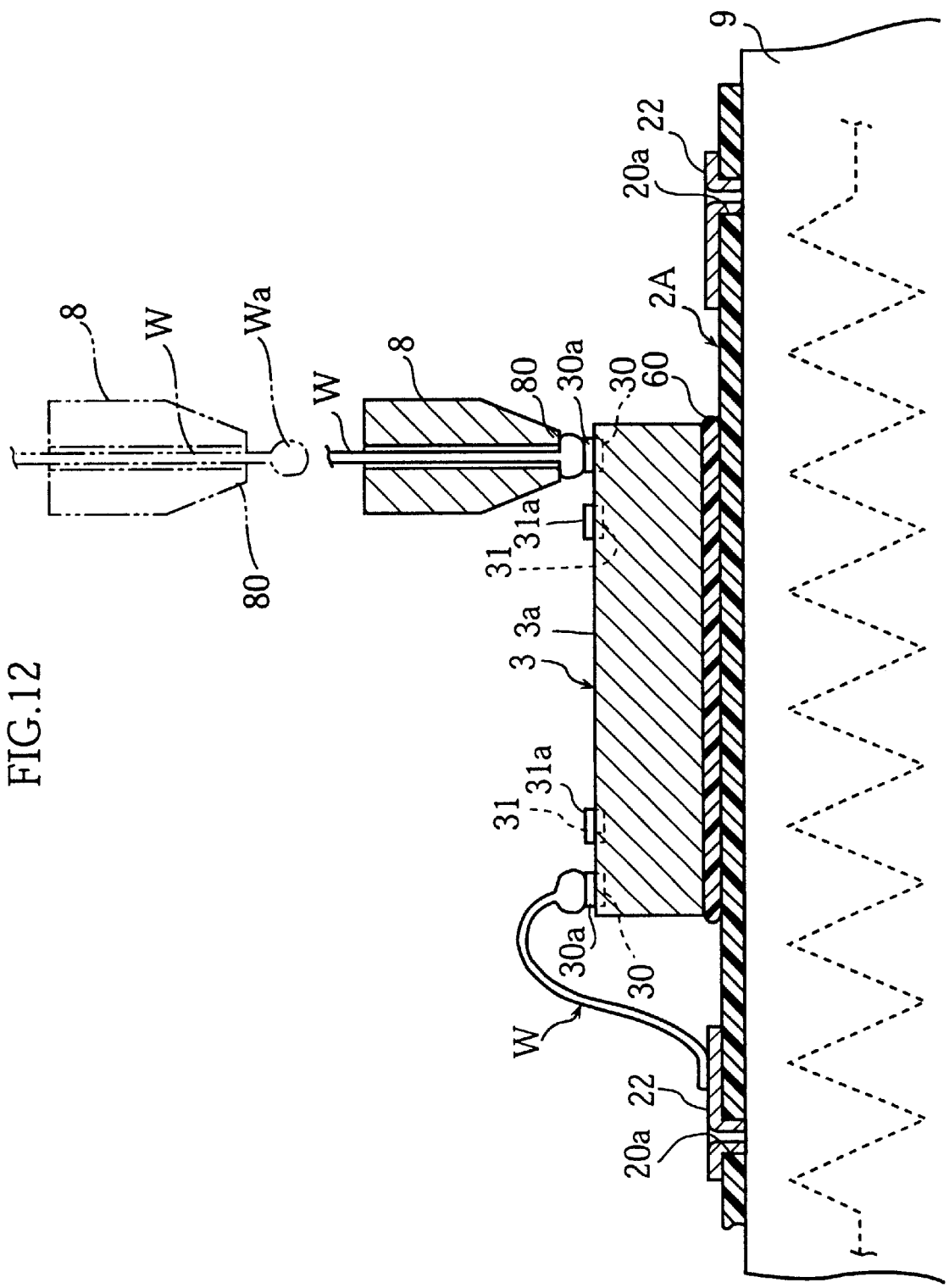
FIG. 12 shows a step of manufacturing the semiconductor device in FIG. 9, illustrating a state of first bonding in wirebonding process.
Figure 13:
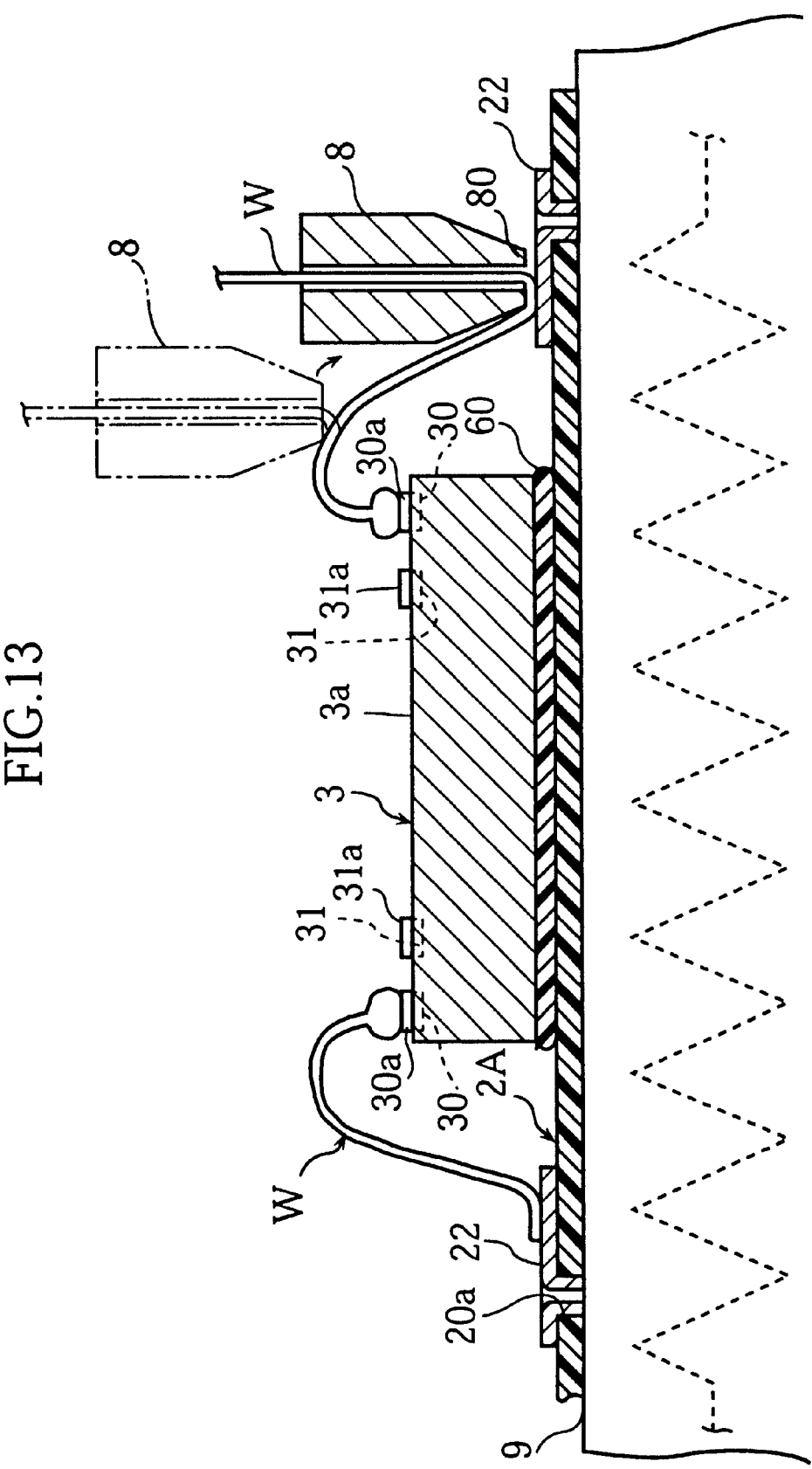
FIG. 13 shows a step of manufacturing the semiconductor device in FIG. 9, illustrating a state of second bonding in the wirebonding process.

The thin-film terminal portion 22 on the ribbon of resin film 2A may be made by first forming a coat of copper for example, in regions corresponding to the through-holes 20a formed in the surface of the resin film 2A by means of spattering, vaporizing, or CVD, and then etching the coat of copper. After forming the thin-film terminal portions 22, the film 2A is then mounted with the FRAM chip 3, with the main surface 3a (which is the surface formed with the first and second gold bumps 30a, 31a) facing upward as shown in FIG. 11. Specifically, this step is achieved by first applying a resin adhesive 60 of a liquid state or a film state to the bonding surface of the resin film 2A or of the FRAM chip 3, and then by lowering the FRAM chip 3 onto the resin film 2A.

The resin adhesive 60 may be an epoxy or phenol resin of a thermosetting type. Preferably however, since the FRAM chip 3 is mechanically bonded to the semiconductor chip 4 by the resin adhesive 6 in a step to be described later, the resin adhesive 60 should be of the same type as the resin adhesive 6, setting at the same temperature for example. If such an arrangement is taken, when the FRAM chip 3 is mounted to the film 2A, the resin adhesive 60 may not be heated to solidify within this step. Instead, for increased manufacturing efficiency, the FRAM chip 3 may be left as temporarily bonded for some time until other predetermined operations are complete. Then, in the step of mechanically bonding the FRAM chip 3 to the semiconductor chip 4 by the resin adhesive 6, the resin adhesive 60 may be heated simultaneously with the resin adhesive 6.

The step of connecting the FRAM chip 3 with the terminal portions 20 of the film 2A by the wire W is performed on a supporting table 9 for example, while the film 2A is held on the supporting table 9 which is heated to 100 degrees Celsius for example. This step comprises the first bonding shown in FIG. 12 and the second bonding shown in FIG. 13. It should be noted that during the step, the FRAM chip 3 and the film 2A are heated to about 100 degrees Celsius. As clearly shown in FIG. 12, the first bonding is performed by repeating a cycle of steps described below. Specifically, an end portion of the gold wire W is drawn out of a tip portion 80 of a capillary 8. The end of the gold wire W is then heated into a ball of molten gold Wa in a hydrogen flame or electric discharge. The capillary 8 is then moved to above the first gold bump 30a, and lowered so that the ball of molten gold Wa is pressed onto the gold bump 30a. It should be noted that supersonic wave may be applied to the bonding region when the gold ball Wa is pressed. Next, the second bonding is performed as clearly shown in FIG. 13. Specifically, with the end of the gold wire W bonded to the bump 30a, the capillary 8 is moved to above the thin-film terminal portion 22 of the film 2A, while allowing the gold wire W to be drawn out of the capillary 8. The tip portion 80 of the capillary 8 is then lowered so that the gold wire W is pressed onto the upper surface of the thin-film terminal portion 22, to which ultrasonic wave is applied at the same time. When the gold wire W is bonded, the capillary 8 is then slid laterally to tear the gold wire W off, completing the cycle of wirebonding.

Figure 14:
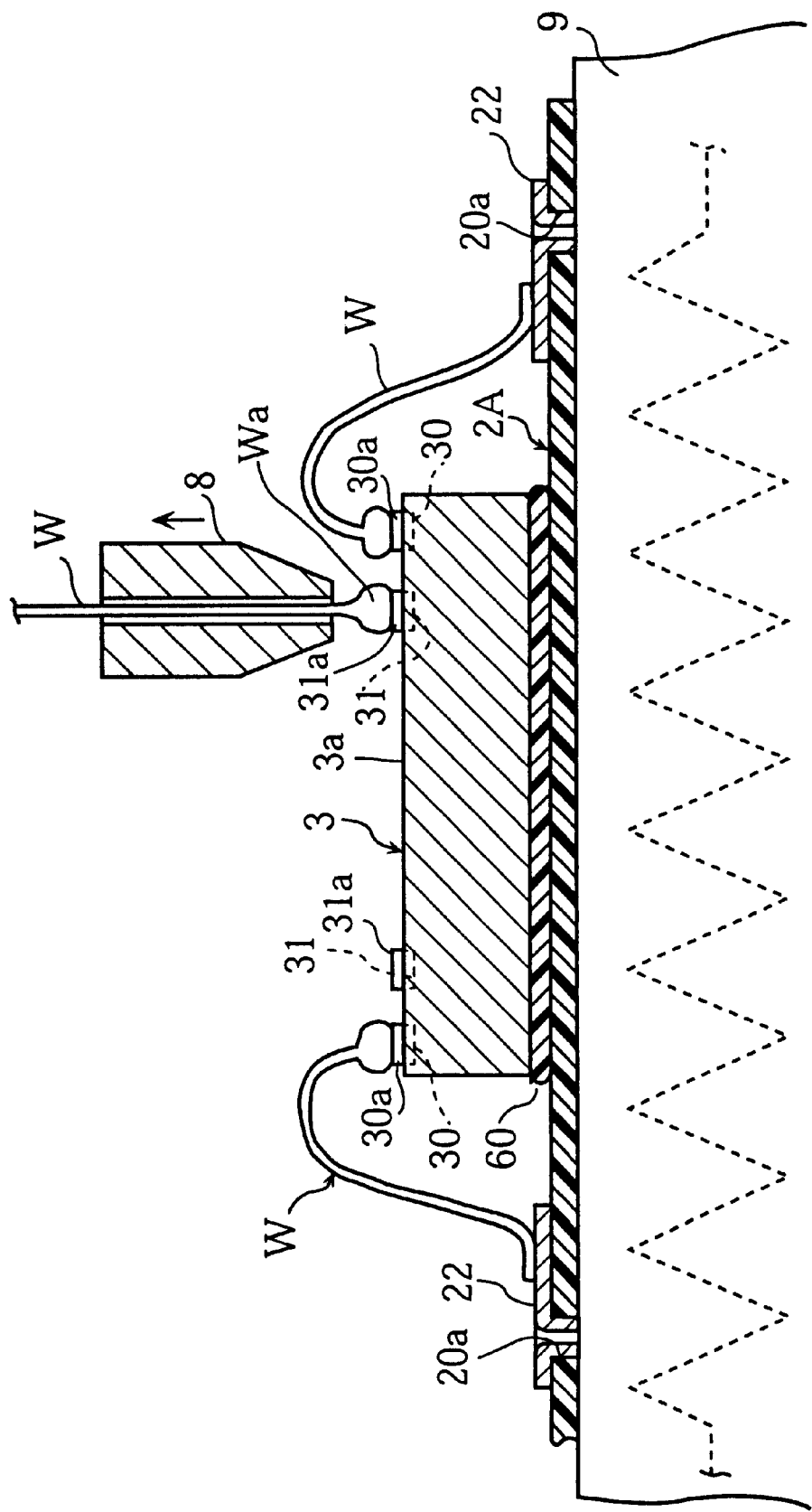
FIG. 14 shows a step of manufacturing the semiconductor device in FIG. 9, illustrating a state in which a stud bump is being formed on an electrode of the FRAM chip.

As shown in FIG. 14, the step of forming the stud bumps 7 on respective second gold bumps 31a can be performed for example, by repeating a cycle similar to the cycle of first bonding of the gold wire W described above. Specifically, while the film 2A is held on the supporting table, an end portion of the gold wire W is drawn out of the tip portion 80 of the capillary 8. The end of the gold wire W is then heated into a ball of molten gold Wa, which is then, pressed onto the second gold bump 31a. Next, with the gold ball Wa still molten or halfway solid, the capillary 8 holding the gold wire W is moved upward to tear the gold wire W off. Each of the stud bumps 7 thus formed has a pointed tip portion which is easily deformed.

AS described above, the stud bumps 7 can be formed by generally the same operation as in the steps of first bonding of the wire bonding cycle. Therefore, if the wirebonding step is included as part of manufacturing process, it is possible to form the stud bumps 7 by simply adding the above cycle as part of the wirebonding step, without making a separate step for specifically forming the stud bumps 7. It should be noted that the gold wire W may not necessarily be cut by the upward movement of the capillary 8, but instead by an external force. Further, when the gold ball Wa is pressed, ultrasonic wave may be applied through the capillary 8. Needless to say, the method for forming the stud bumps 7 is not limited by the one described above, and the stud bumps may be formed in any other way.

Figure 15:
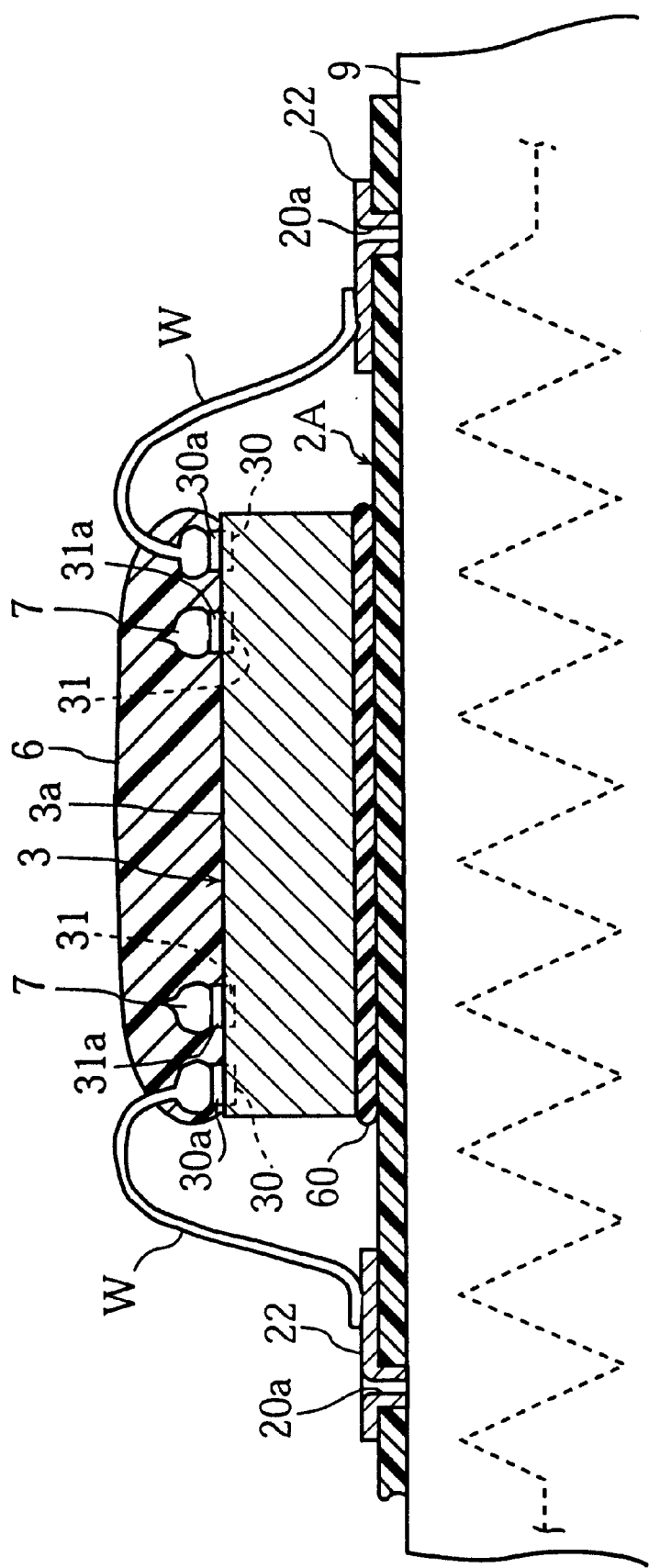
FIG. 15 shows a step of manufacturing the semiconductor device in FIG. 9, illustrating a state in which a surface of the FRAM formed with electrode pads is applied by a liquid resin adhesive.

Next, as shown in FIG. 15, the step of applying the resin adhesive 6 to the main surface 3a (the surface formed with the gold bumps) of the FRAM chip 3 is performed while the FRAM chip 3 and other relevant components are still held on the supporting table 9 under heat. The resin adhesive 6 used in this step may be an epoxy resin or a phenol resin, and can be advantageously selected from those setting at a temperature of about 100 degrees Celsius. The resin adhesive 6, of a liquid type for example, is applied to the main surface 3a (which is the surface formed with the gold bumps) of the FRAM chip 3, covering the first and second gold bumps 30a, 31a. Needless to say, the resin adhesive 6 may be a solid sheet type instead.

Figure 16:
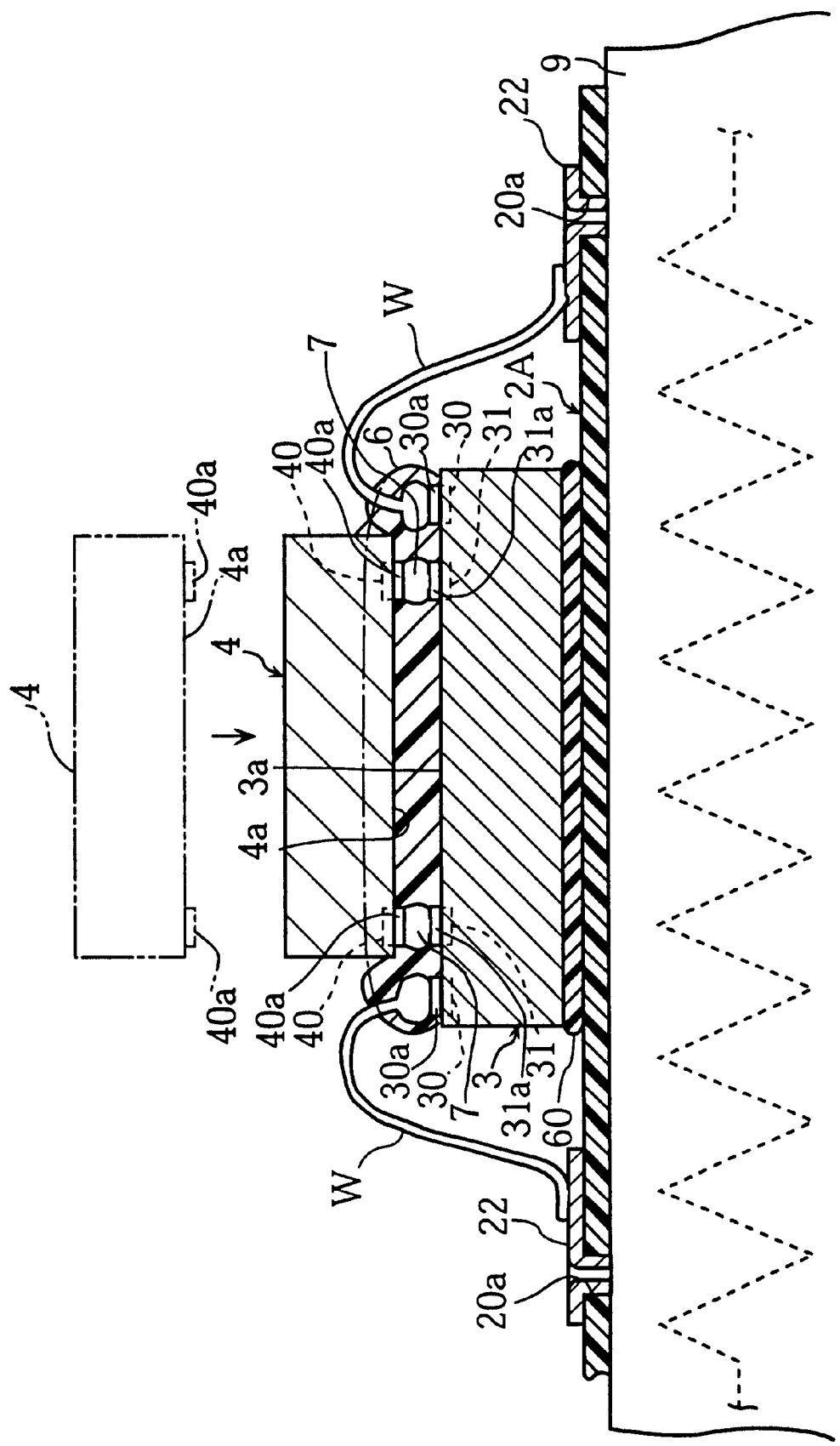
FIG. 16 shows a step of manufacturing the semiconductor device in FIG. 9, illustrating a state in which a semiconductor chip is being connected to the FRAM chip.

As shown in FIG. 16, the next step is facing the second gold bumps 31a of the FRAM chip 3 with respective gold bump terminals 40a of the semiconductor chip 4, and sandwiching the stud bumps 7 between the second gold bumps 31a and the gold bump terminals 40a. This step is performed again while the relevant components are held on the supporting table 9. This step is completed by pressing the semiconductor chip 4 to the FRAM chip 3. During this operation, the semiconductor chip 4 is temporarily supported on the FRAM chip 3 by the stud bumps 7, while at the same time, the electric connection is established between each pair of the second gold bumps 31a and the gold bump terminals 40a.

The stud bumps 7 can be deformed easily by compression. Thus, when the semiconductor chip 4 is pressed to the FRAM chip 3, the stud bumps 7 deforms by the compression, protecting the FRAM chip 3 and the semiconductor chip 4 from excessive compression. More specifically, the stud bumps 7 between the gold bumps 31a and the gold bumps 40a absorbs part of load externally applied, preventing the FARM chip 3 and the semiconductor chip 4 from being damaged. It should be noted that the main surface 3a (which is the surface formed with the gold bumps) of the FRAM chip 3 is applied with the resin adhesive 6 of a liquid or sheet type.

Though not illustrated, the step of mechanically bonding the FRAM chip 3 to the semiconductor chip 4 is completed by solidifying the resin adhesive 6 placed between the FRAM chip 3 and the semiconductor chip 4. Again, this step is performed with the relevant components held on the supporting table 9, and thus, the resin adhesive 6 can be solidified by the heat supplied by the supporting table. In other words, there is no need for a separate heating step which requires a heating furnace for example. Thus, it becomes possible to simplify the manufacturing process.

Next, the FRAM chip 3, the second semiconductor chip 4, and the gold wire W are buried into a resin package 61 made of an epoxy resin for example. The packaging can be achieved by transfer molding for example. Then the solder terminal portions 21 each communicating through corresponding through-hole 20a with the thin-film terminal portion 22 are formed on the lower surface of the film 2A. Finally, each semiconductor device 1 is separated from the resin film 2A as the individual semiconductor device 1 as shown in FIGS. 9 and 10.

As has been described, according to the above-described method of manufacturing the semiconductor device 1, steps of placing the FRAM chip 1 onto the resin film 2, wirebonding the FRAM 3 with the semiconductor chip 4, and bonding the FRAM chip 3 to the semiconductor chip 1 mechanically and electrically, can be performed on the supported table 9 while the relevant components are heated only to about 100 degrees Celsius. Thus, it becomes possible to manufacture the semiconductor device 1 even if the FRAM 3 which is very susceptible to heat damage is being used.

What is claimed is :

1. A method for making a semiconductor device which includes a substrate formed with a terminal, a first semiconductor chip mounted on the substrate and having a main surface formed with an inner electrode pad and an outer electrode, a second semiconductor chip having a main surface facing the first semiconductor chip and formed with an electrode pad opposed to the inner electrode pad of the first semiconductor chip, and a package containing the first and the second semiconductor chips, the first and the second semiconductor chips being electrically connected with each other within the package, the method comprising steps of;

forming a gold bump on the electrode pad of the first semiconductor chip, forming a gold bump on the electrode pad of the second semiconductor chip, electrically connecting the terminal of the substrate to the outer electrode pad of the first semiconductor chip through a gold wire which is supplied from a capillary;

forming an easily deformable gold stud bump on the gold bump of the first semiconductor chip or on the gold bump of the second semiconductor chip, the stud bump being formed by using the same capillary as previously used for electrically connecting the terminal of the substrate to the outer electrode pad of the first semiconductor chip;

causing the first and the second semiconductor chips to face each other so that the electrode pad on the first semiconductor chip faces the electrode pad on the second semiconductor chip, and pressing the semiconductor chips to each other.

2. The method according to claim 1, wherein the first semiconductor chip and the second semiconductor chip are pressed against each other with a resin adhesive placed between the first and second semiconductor chips.

3. The method according to claim 2, wherein the resin adhesive is selected from the group consisting of an epoxy resin adhesive and a phenol resin adhesive.

4. The method according to claim 1, wherein the gold stud bump is formed by first forming a ball at a lower end of a gold wire which extends through said same capillary and then separating the ball from the gold wire.

5. The method according to claim 4, wherein the gold stud bump initially has a pointed projection before pressing the semiconductor chips.

6. The method according to claim 1, wherein the first semiconductor chip is a ferroelectric memory chip.

* * * * *